United States Patent
Qu et al.

(10) Patent No.: US 11,744,049 B2
(45) Date of Patent: Aug. 29, 2023

(54) HEAT DISSIPATION DEVICE FOR ELECTRONIC COMPONENT

(71) Applicant: Valeo Siemens eAutomotive (Shenzhen) Co., Ltd., Shenzhen (CN)

(72) Inventors: Gongyuan Qu, Shenzhen (CN); Ronghui Li, Shenzhen (CN)

(73) Assignee: Valeo Siemens eAutomotive (Shenzhen) Co., Ltd., Shenzhen (CN)

( * ) Notice: Subject to any disclaimer, the term of this patent is extended or adjusted under 35 U.S.C. 154(b) by 119 days.

(21) Appl. No.: 17/119,176

(22) Filed: Dec. 11, 2020

(65) Prior Publication Data

US 2021/0185861 A1  Jun. 17, 2021

(51) Int. Cl.
 *H01L 23/31* (2006.01)
 *H05K 7/20* (2006.01)
 *H05K 5/02* (2006.01)

(52) U.S. Cl.
 CPC ......... *H05K 7/20845* (2013.01); *H01L 23/31* (2013.01); *H05K 5/0213* (2013.01); *H05K 7/2089* (2013.01); *H05K 7/20463* (2013.01)

(58) Field of Classification Search
 CPC .................................................. H01L 23/315
 See application file for complete search history.

(56) References Cited

U.S. PATENT DOCUMENTS

2012/0086003 A1* 4/2012 Park ................... H01L 23/3121
                                                                  257/737

FOREIGN PATENT DOCUMENTS

| CN | 104065248 A | 9/2014 |
|---|---|---|
| CN | 205355868 U | 6/2016 |
| CN | 206790818 U | 12/2017 |
| CN | 207588513 U | 7/2018 |
| EP | 2876987 A2 | 5/2015 |

OTHER PUBLICATIONS

English Version of CN 104065248, 14 pages, published Sep. 24, 2014, "power conversion device". (Year: 2014).*
Communication from the Examining Division issued in corresponding European Application No. 20213216.3, dated May 12, 2021 (39 pages).
Second Office Action in corresponding Chinese Application No. 202110249002.4, dated Sep. 9, 2022 (13 pages).

* cited by examiner

*Primary Examiner* — Hung V Ngo
(74) *Attorney, Agent, or Firm* — Osha Bergman Watanabe & Burton LLP

(57) ABSTRACT

Disclosed are an electrical apparatus, a method for manufacturing an electrical apparatus, and a motor vehicle, and the electrical apparatus. In the apparatus, a chamber includes a first electrical element located at a first position and a second electrical element located at a second position, the first electrical element and the second electrical element having different heat dissipation characteristics. The electrical apparatus further includes a potting spacer, the potting spacer separating the chamber into two sub-chambers: a first sub-chamber and a second sub-chamber. The first electrical element is located in the first sub-chamber, and the second electrical element is located in the second sub-chamber.

17 Claims, 6 Drawing Sheets

HEAT DISSIPATION DEVICE FOR ELECTRONIC COMPONENT

CROSS-REFERENCE TO RELATED APPLICATIONS

This application claims priority to Chinese patent application CN 201911262891.7, filed on Dec. 11, 2019.

BACKGROUND OF INVENTION

Field of the Invention

The present invention relates to the field of electrical technology, in particular to an electrical apparatus, a method for manufacturing an electrical apparatus, and a motor vehicle.

Background Art

With the wide application of electric technology in civil and commercial fields, stricter requirements have been imposed on electrical apparatuses, especially those applicable to motor vehicles.

In a conventional electrical apparatus, a plurality of electrical elements are generally disposed in a chamber; when the chamber is to be potted, the same potting material is used to pot the plurality of electrical elements. In this case, in order to meet the heat dissipation needs of an electrical element that has a high heat dissipation rate and a large heat dissipation height, a potting material having a high heat dissipation rate is generally selected, and the potting height of the potting material is made larger than the heat dissipation height of the electrical element in the chamber which has the largest heat dissipation height.

When the above-described potting method is adopted, on the one hand, use of the same potting material for all the electrical elements is not conducive to meeting the heat dissipation needs of each electrical element; on the other hand, if the potting heights of all the electrical elements are the same, then certain electrical elements will be potted more than needed, which leads to a waste of potting materials while increasing the manufacture costs and the total weight of the electrical apparatus.

Therefore, there is a need for a method for manufacturing an electrical apparatus, an electrical apparatus and a motor vehicle which can meet heat dissipation needs of different electrical elements, reduce the manufacture costs, and allow the electrical apparatus to have a relatively small total weight, on the premise of achieving good potting of the electrical apparatus.

SUMMARY OF INVENTION

In order to solve the above-described problems, the present invention provides an electrical apparatus, a method for manufacturing an electrical apparatus, and a motor vehicle. The method for manufacturing an electrical apparatus provided by the present invention can meet the heat dissipation needs of different electrical elements, allow the electrical apparatus to have a relatively small total weight and relatively low manufacture costs, on the premise of achieving good potting of the electrical device apparatus.

According to one aspect of the present invention, an electrical apparatus is proposed, the electrical apparatus includes: a chamber, the chamber at least includes a first electrical element located at a first position and a second electrical element located at a second position, the first electrical element and the second electrical element have different heat dissipation characteristics; wherein the electrical apparatus further includes a potting spacer, the potting spacer separates the chamber into two sub-chambers: a first sub-chamber and a second sub-chamber, respectively, and the first electrical element is located in the first sub-chamber, the second electrical element is located in the second sub-chamber.

In certain embodiments, heat dissipation characteristics of the first electrical element and the second electrical element include a heat dissipation height of the first electrical element and of the second electrical element and/or a heat dissipation parameter of the first electrical element and of the second electrical element.

In certain embodiments, a first potting material at least partly filling the first sub-chamber and a second potting material at least partly filling the second sub-chamber are different in at least one of materials, potting heights, and heat conductivities.

In certain embodiments, the potting spacer is made of a compressible material.

In certain embodiments, the potting spacer, by press fit, is mounted between two opposite inner chamber sidewalls in the chamber.

In certain embodiments, the potting spacer is provided with engagement sidewalls that comes into contact with the inner chamber sidewall, the engagement sidewalls comprising at least one rib that is disposed on the engagement sidewalls.

In certain embodiments, the potting spacer is provided with a through hole through which an electrical conductor passes, wherein the potting spacer includes a first portion and a second portion hinged together, the electrical conductor can enter the through hole when the first portion and the second portion are in an open status, and the electrical conductor is mounted in the through hole after the first portion and the second portion are assembled together.

In certain embodiments, the electrical conductor connects the first electrical element to the second electrical element.

In certain embodiments, the first portion and the second portion are assembled by a groove and a protrusion which fit each other.

In certain embodiments, the through hole is provided with at least one contact rib on a surface in contact with the electrical conductor.

In certain embodiments, the potting spacer is formed into a single piece.

In certain embodiments, the potting spacer comprises a first dividing sidewall which faces the first sub-chamber and a second dividing sidewall which faces the second sub-chamber, and a positioning portion is disposed on at least one of the first dividing sidewall and the second dividing sidewall, the positioning portion locating the potting spacer in position in the chamber.

In certain embodiments, the potting spacer is made of rubber.

In certain embodiments, the electrical apparatus is formed into a charging apparatus for a vehicle, or an inverter, or a direct current-direct current converter.

According to another aspect of the present invention, a method for manufacturing an electrical apparatus is provided, the method includes: providing a chamber; disposing a first electrical element at least at a first position of the chamber and disposing a second electrical element at a second position of the chamber, the first electrical element and the second electrical element having different heat dissipation characteristics; and providing a potting spacer which separates the chamber into two sub-chambers: a first sub-chamber and a second sub-chamber, the first electrical element is located in the first sub-chamber, the second electrical element is located in the second sub-chamber.

In certain embodiments, the heat dissipation characteristics of the first electrical element and the second electrical element include a heat dissipation height of the first electrical element and of the second electrical element and/or a heat dissipation rate parameter of the first electrical element and of the second electrical element.

In certain embodiments, the method further comprises: filling, at least partly, the first sub-chamber with a first potting material, and filling, at least partly, the second sub-chamber with a second potting material, the first potting material and the second potting material are different in at least one of materials, potting heights, and heat conductivities.

According to another aspect of the present invention, a motor vehicle is provided, which includes the above-described electrical apparatus.

With an electrical apparatus, a method for manufacturing an electrical apparatus, and a motor vehicle that are provided by the present invention, each electrical element in an electrical apparatus may be potted effectively. Especially, the manufacture cost is relatively low, and a manufactured electrical apparatus has a relatively small total weight.

Other aspects and advantages of the invention will be apparent from the following description and the appended claims.

BRIEF DESCRIPTION OF DRAWINGS

In order to more clearly describe the technical solution of embodiments of the present invention, the drawings used to illustrate the embodiments will be briefly described below. Obviously, the drawings described below show only some embodiments of the present invention, and those of ordinary skill in the art, without creative labour, can further obtain other drawings based on these drawings. The following drawings, instead of being created by meticulously reducing and enlarging actual sizes in proportion, lay emphasis on showing an objective of the present invention.

DETAILED DESCRIPTION

Technical solutions provided in embodiments of the present invention will be clearly and completely described with reference to drawings below. Obviously, the described embodiments are only some, but not all, of the embodiments of the present invention. All other embodiments obtained by those of ordinary skill in the art based on the described embodiments of the present invention without making inventive efforts also fall into the protection scope of the present invention.

As indicated in the present application and claims, unless otherwise expressly specified in the context, a word like "a", "one", "one type", and/or "the", instead of referring in particular to the singular, may also include the plural. Generally, terms "comprise" and "include" only suggest inclusion of expressly identified steps and elements, but these steps and elements do not constitute an exclusive enumeration; a method or device may also include other steps or elements.

Although the present application contains various citations of certain modules in systems that are based on embodiments of the present application, any number of different modules may be used and operate on a user terminal and/or server. The module is only illustrative, and different modules may be used in different aspects of the system and method.

In the present application, a flowchart is used to explain operations performed by a system according to an embodiment of the present application. It should be understood that the preceding or subsequent operations are not necessarily performed in a precise sequence. On the contrary, based on needs, various steps may be performed in sequence or at the same time. In addition, other operations may also be added to these processes, or one or more steps may be removed from these processes.

Figure 1:
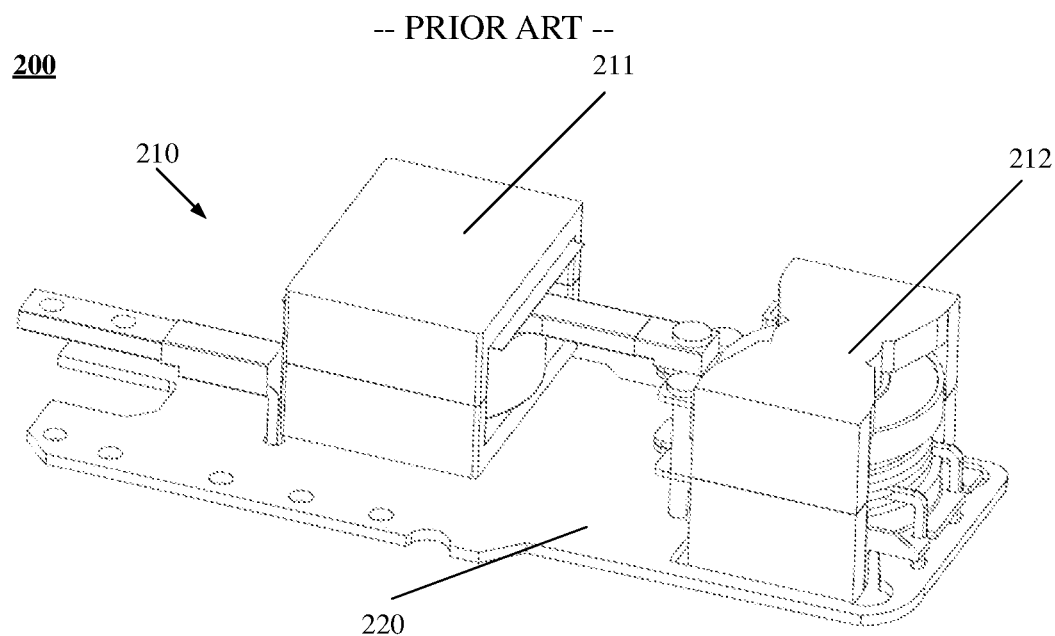
FIG. 1 is a stereogram of a chamber 210 in a known electrical apparatus 200.

FIG. 1 is a stereogram of a chamber 210 in a known electrical apparatus 200, wherein inner chamber sidewalls of the chamber 210 are not shown. As shown in FIG. 1, two electrical elements are disposed in the chamber 210 of the electrical apparatus 200; they are an inductor 211 and a transformer 212, respectively. They are, for example, disposed on a circuit board 220 and have different heat dissipation characteristics.

When the chamber 210 of the electrical apparatus 200 is to be potted, because the same potting material is used for the same chamber, the same potting material will be used for the inductor 211 and the transformer 212 in the chamber 210, and the inductor 211 and the transformer 212 will be potted to reach the same height. For example, the same potting glue will be used for the inductor 211 and the transformer 212, and they will be potted to reach the same potting height.

However, on the one hand, the inductor 211 and the transformer 212 have different heat dissipation characteristics; a transformer, compared with an inductor, has a higher heat dissipation rate, which is, generating greater heat. When potting is to be performed, if the heat dissipation characteristic of the transformer needs to be met, then it is necessary to select a potting material which has a high heat dissipation rate; the potting material is high-cost, and the potting material having a high heat dissipation rate is unnecessary to the inductor 211. If the heat dissipation characteristic of the inductor 211 needs to be met, then it is necessary to select a potting material which has a low heat dissipation rate; however, in this case, heat generated by the transformer cannot be conducted in a timely manner, and use of the transformer is affected. Under such a circumstance, the heat dissipation needs of each electrical element cannot be met effectively, and there exists the problem of an increase in manufacture costs.

On the other hand, because potting is performed in the same chamber, the potting heights of each electrical element in the chamber are the same; in this case, if heat generated by each electrical element is to be conducted sufficiently, it is necessary to make the potting height of the potting material greater than or equal to the heat dissipation height of the electrical element which has the largest heat dissipation height in the chamber. This will cause a waste of potting materials and an increase in costs.

For example, if the inductor 211 and the transformer 212 are disposed in the chamber, the transformer has a high heat dissipation rate and a small heat dissipation height, and the inductor has a low heat dissipation rate and a large heat dissipation height, then, in the process of potting, on the one hand, in order to meet the heat dissipation need of the transformer, a potting material having high heat conductivity (which is high-cost) will be selected; on the other hand, in order to allow complete heat dissipation of the inductor, it is necessary to make the potting height of the potting material greater than or equal to the heat dissipation height of the inductor 211, which requires a large amount of potting. In this case, a potting material having high heat conductivity will be used to reach a relatively large heat dissipation height, which causes a waste of potting materials, an increase in manufacture costs, and an increase in the total weight of the electrical apparatus.

Based on the above, the present application proposes an electrical apparatus, in which a potting spacer separates a chamber of the electrical apparatus into two sub-chambers, and a first electrical element and a second electrical element which have different heat dissipation characteristics are located in different sub-chambers, respectively, so that when the electrical apparatus is potted, different potting materials and different amounts of potting may be used in each sub-chamber based on the heat dissipation characteristics of the electrical elements therein.

Figure 2A:
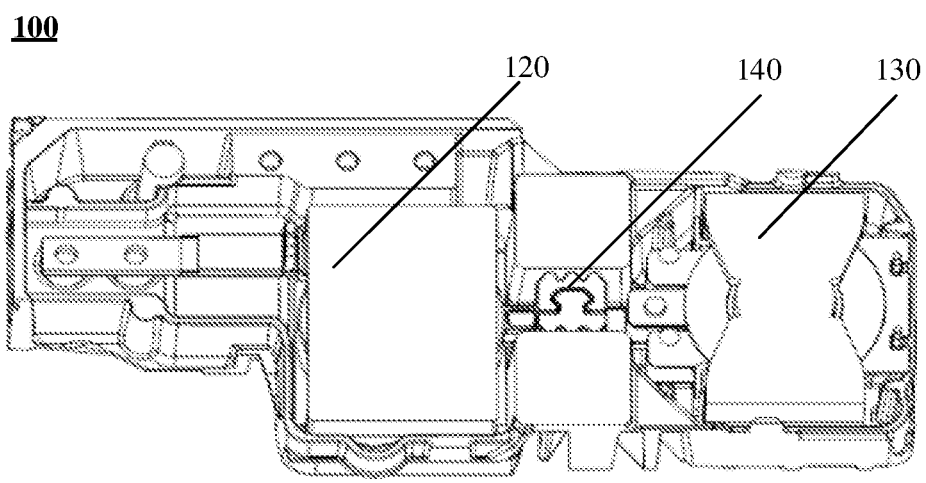
FIG. 2A is a top view of the electrical apparatus 100 according to an embodiment of the present invention in which a potting spacer 140 is disposed.
Figure 2B:
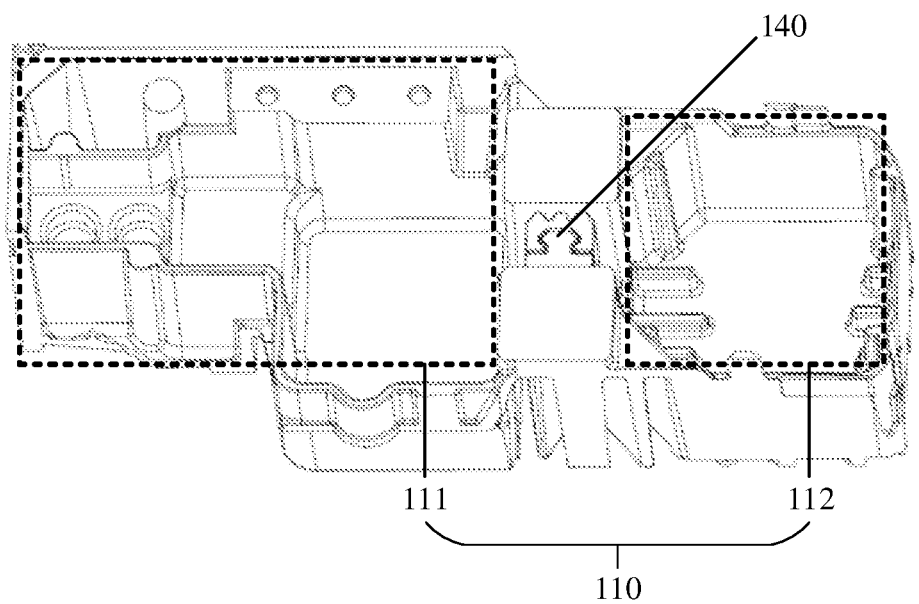
FIG. 2B is a stereogram of the electrical apparatus 100 shown in FIG. 2A, wherein the first electrical element or the second electrical element is not shown, according to an embodiment of the present disclosure.

FIG. 2A is a top view of the electrical apparatus 100 according to an embodiment of the present invention in which a potting spacer 140 is disposed; FIG. 2B is a stereogram of the electrical apparatus 100 shown in FIG. 2A, wherein the first electrical element and the second electrical element are not shown.

Referring to FIGS. 2A and 2B, the electrical apparatus 100 includes: a chamber 110, the chamber 110 at least comprises a first electrical element 120 located at a first position and a second electrical element 130 located at a second position, the first electrical element 120 and the second electrical element 130 having different heat dissipation characteristics.

The electrical apparatus, for example, may be a charging apparatus for charging an electrical device or motor vehicle, or may be an inverter, a direct current-direct current (DC-DC) converter, or another type of electrical apparatus. The present application is not limited to a specific type of the electrical apparatus.

The electrical apparatus, for example, may be composed of a circuit board and a housing; in this case, the first electrical element and the second electrical element, for example, may be disposed on the circuit board, a sidewall of the housing, for example, may be formed into an inner inner chamber sidewall of the chamber 110, and the bottom wall of the housing, for example, may be formed into the chamber bottom wall of the chamber. However, the electrical apparatus may also be composed of an upper housing and a lower housing, or may be composed of another components.

The heat dissipation characteristic refers to a parameter used to describe a characteristic exhibited by an electrical element when it dissipates heat to the outside environment. The heat dissipation characteristic, for example, may be the heat dissipation height of an electrical element, or may also be the heat dissipation rate of a heat dissipation element, namely, the amount of heat generated by it in unit time, or may also be another heat dissipation characteristic parameters.

The first electrical element and the second electrical element are intended to differentiate between two electrical elements which have different heat dissipation characteristics, instead of limiting the electrical elements.

For example, referring to FIG. 2A, the first electrical element 120, for example, may be an inductor which has a relatively low heat dissipation rate and generates a relatively small amount of heat in unit time; the second electrical element 130, for example, may be a transformer which has a relatively high heat dissipation rate and generates a relatively large amount of heat in unit time.

However, it should be understood that the first electrical element and the second electrical element may also be other components, as long as they have different heat dissipation characteristics.

In certain embodiments, the chamber, for example, may only comprise the first electrical element and the second electrical element. Alternatively, the chamber may also comprise a plurality of electrical elements, for example, it may further comprise 3 electrical elements, or it may further comprise 5 electrical elements.

The electrical apparatus further comprises a potting spacer 140, the potting spacer 140 separating the chamber 110 into two sub-chambers: a first sub-chamber 111 and a second sub-chamber 112, the first electrical element 120 is located in the first sub-chamber 111, the second electrical element 130 is located in the second sub-chamber 112.

The potting spacer is intended to characterize a component used to separate a chamber of the electrical apparatus in the process of potting; it, for example, may be made of rubber, or may be made of another elastic material.

The potting spacer, for example, may be an integrated single piece, or may also comprise a plurality of sub-components. The plurality of sub-components, for example, may be joined to one another by plugging or bonding to form the potting spacer.

The first sub-chamber and the second sub-chamber are intended to differentiate between two different chambers separated by a potting spacer, instead of being intended to limit the sub-chambers. The first sub-chamber and the second sub-chamber, for example, may be sub-chambers which have the same volume, or may also be sub-chambers which have different volumes.

Based on the preceding description, a potting spacer is used to separate a chamber in an electrical apparatus into a first sub-chamber and a second sub-chamber, and a first electrical element and a second electrical element that have different heat dissipation characteristics in the chamber are located, respectively, in the first sub-chamber and the second sub-chamber obtained after the separation. Thus, when the electrical apparatus is potted, based on respective heat dissipation characteristics possessed by the first electrical element and the second electrical element, different potting materials may be selected for the first sub-chamber and the second sub-chamber, and the first sub-chamber and the second sub-chamber may be potted, respectively, to reach different potting heights. Compared with a situation of potting in the same chamber, an electrical apparatus of the present application allows selection of potting materials based on heat dissipation characteristics of different electrical elements, effectively meeting heat dissipation needs of different electrical elements. In addition, when a plurality of electrical elements in the same chamber are potted, it prevents the problem of a waste of potting materials, which result from that the potting height is larger than heights actually needed by certain electrical elements, and further allows the electrical apparatus to have a relatively small total weight.

In certain embodiments, heat dissipation characteristics of the first electrical element 120 and the second electrical element 130 include a heat dissipation heights of the first electrical element 120 and of the second electrical element 130 and/or a heat dissipation parameters of the first electrical element 120 and of the second electrical element 130.

The heat dissipation height is intended to characterize the distance in a vertical direction between the highest point of the dissipation region of the electrical element which is able to dissipate heat in an inner chamber of the electrical apparatus and the bottom wall of the inner chamber of the electrical apparatus. It, for example, may be the height of the electrical element itself, or may also be a part of the height of the electrical element itself. For example, it may be the height of a heat dissipator carried by the electrical element, or may also be the height of a hole-shape heat-dissipating region provided on a sidewall of the electrical element.

The heat dissipation parameter is a parameter that characterizes the ability of the electrical element to dissipate heat to the outside environment. It, for example, may be heat dissipation rate, that is, the amount of heat dissipated by the electrical element to the outside environment in unit time, which for example, may be characterized by watts per second (watt/s). Alternatively, the heat dissipation rate may also be another parameters, for example, detecting the amount of heat dissipated by the electrical element in unit time in an ultimate status and using it as the heat dissipation parameter.

Based on the preceding description, in the present application, heat dissipation characteristics include the heat dissipation height of an electrical element and the heat dissipation parameter of the electrical element. Thus, based on the heat dissipation height and heat dissipation parameter of the electrical element, a potting material and its potting height may be selected rationally, so that, in the process of potting, the heat dissipation needs of different electrical elements are better met, and the working efficiencies and service life of the electrical elements in the electrical apparatus are increased.

In certain embodiments, a first potting material at least partly filling the first sub-chamber 111 and a second potting material at least partly filling the second sub-chamber 112 are different in at least one of materials, potting heights, and heat conductivities.

The potting material characterizes a material for potting an inner chamber of an electrical apparatus. The potting process presents a process in industrial in which a liquid compound is mechanically or manually poured into a device loaded with electrical elements and circuits, and cured, at room temperature or by heating, into a thermosetting high-molecular insulation material that delivers excellent performance. In addition, the potting material, for example, may be potting glue, or may be a resin, or may be other materials which can fill, at least partly, a chamber and then can be cured at room temperature or by heating.

The potting height of the potting material is intended to present the height by which the potting material fills a chamber of the electrical apparatus. For example, the potting height may be set on the basis of actual needs, for example, the potting height of the potting material may be set to the maximum heat dissipation height of the electrical elements in the chamber, or the potting height of the potting material may also be set to 1.2 times the maximum heat dissipation height of the electrical elements.

Heat conductivity of the potting material is a parameter which presents the heat-conducting ability of the potting material. Higher heat conductivity characterizes a greater heat-conducting ability, that is to say, conducting more heat in unit time and producing a better heat dissipation effect.

The first potting material and the second potting material, for example, may both be a single potting material, or may also each be a compound potting material compounded of a plurality of potting materials.

For example, when the first electrical element disposed in the first sub-chamber is an inductor, the second electrical element disposed in the second sub-chamber is a transformer, and the heat dissipation height H1 of the inductor is larger than the heat dissipation height H2 of the transformer, considering that the heat dissipation rate of an inductor is lower than that of a transformer, for example, a potting material having relatively low heat conductivity may be selected for the first sub-chamber in which the inductor is located, and the potting height of the potting material in the first sub-chamber can be H1. At the same time, a potting material having relatively high heat conductivity may be selected for the second sub-chamber in which the transformer is located, and the potting height of the potting material in the second sub-chamber can be H2. Thus, the heat dissipation needs of the first electrical element and the second electrical element are properly met in the process of potting, and the electrical apparatus is allowed to have a relative small total weight.

Based on the preceding description, by setting the first potting material and the second potting material to be different in at least one of materials, potting heights, and heat conductivities, so that the compositions, potting heights, and heat conductivities of the first potting material and the second potting material may be selected flexibly on the basis of different heat dissipation characteristics possessed by the first electrical element and the second electrical element themselves; thus, on the basis of well meeting the heat dissipation needs of the first electrical element and the second electrical element, a reduction in costs and a decrease in the total weight of the electrical apparatus are allowed.

In certain embodiments, the potting spacer 140 is made of a compressible material. Setting the potting spacer to be made of a compressible material makes it easy to mount or buckle, by compression fit, the potting spacer in a chamber of the electrical apparatus, thereby conveniently achieving separation of the chamber.

Figures 3A, 3B:
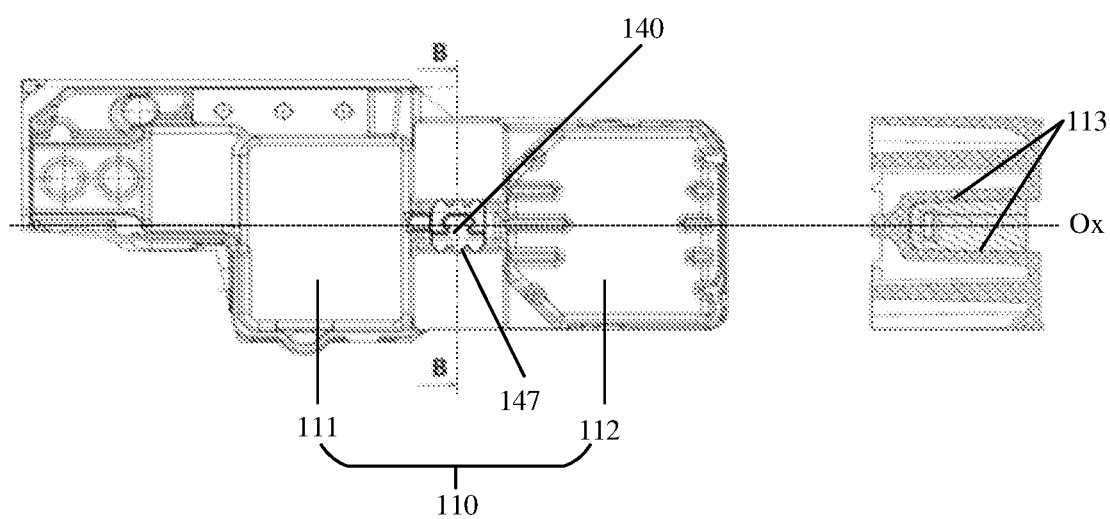
FIG. 3A is a top view of the potting spacer 140 mounted in the chamber 110 of the electrical apparatus 100 according to an embodiment of the present disclosure.
FIG. 3B is a sectional view of the electrical apparatus shown in FIG. 3A taken along line B-B, according to an embodiment of the present disclosure.

FIG. 3A is a top view of the potting spacer 140 mounted in the chamber 110 of the electrical apparatus 100 according to an embodiment of the present disclosure, and FIG. 3B is a sectional view of the electrical apparatus shown in FIG. 3A taken along line B-B.

Referring to FIGS. 3A and 3B, in certain embodiments, the potting spacer 140, by press fit, is mounted between two opposite inner chamber sidewalls 113 in the chamber 110, wherein an axial centre line Ox of the chamber 110 in an axial direction is also shown. The press fit, for example, may be compression-fit, or may be other forms of press fit.

Based on the preceding description, mounted by press fit between two opposite inner chamber sidewalls in the chamber, the potting spacer may, relative to the chamber, remain in position in a direction perpendicular to the axial centre line Ox, which allows the potting spacer to be fit properly in the electrical apparatus.

Further, referring to FIG. 3A, in some embodiments, the potting spacer 140 is provided with engagement sidewalls which come into contact with the inner chamber sidewalls, the engagement sidewalls comprises at least one rib 147 which is disposed on the engagement sidewalls.

For example, three continuous ribs as shown in FIG. 3A may be disposed on the engagement sidewalls of the potting spacer, the three continuous ribs forming a finger structure. However, it should be understood that another number of ribs, for example, one rib or five ribs, may also be disposed on engagement sidewalls of the potting spacer.

If the inner chamber sidewall extends in a first extension direction that is perpendicular to the inner chamber bottom wall of the electrical apparatus, then at least one rib disposed on the inner chamber sidewalls is extended in a direction parallel to the first extension direction, in order to prevent the potting material of the first sub-chamber and the second sub-chamber from flowing across the potting spacer.

Based on the above, by the arrangement of at least one rib on engagement sidewalls on which the potting spacer comes into contact with the inner chamber sidewall, the potting spacer may be tightly joined to the inner chamber sidewall to improve the sealing of the joint between the potting spacer and the inner chamber sidewall, and prevent the potting material of the first sub-chamber and the second sub-chamber from flowing across the potting partition, thereby improving the potting effect.

Figure 4A:
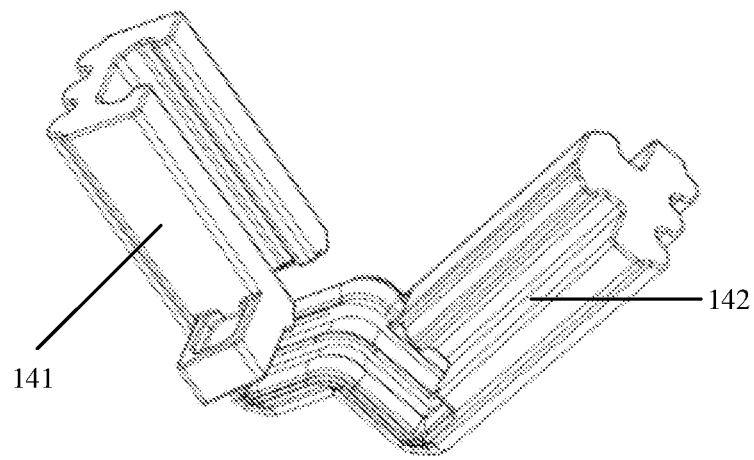
FIG. 4A is a stereogram of a potting spacer according to an embodiment of the present disclosure, wherein the first portion and the second portion of the potting spacer are in an open status, according to an embodiment of the present disclosure.
Figure 4B:
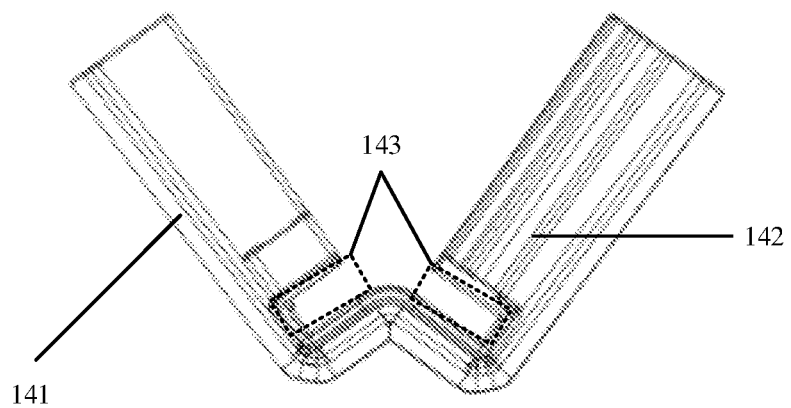
FIG. 4B is a side view of the potting spacer shown in FIG. 4A, according to an embodiment of the present disclosure.

In certain embodiments, the potting spacer, for example, may comprise a plurality of sub-components. FIG. 4A is a stereogram of a potting spacer according to an embodiment of the present disclosure, wherein the first portion and the second portion of the potting spacer are in an open status. FIG. 4B is a side view of the potting spacer shown in FIG. 4A, and FIG. 4C is a stereogram of the potting spacer shown in FIG. 4A, wherein the first portion and the second portion of the potting spacer are in a closed status.

Figure 4C:
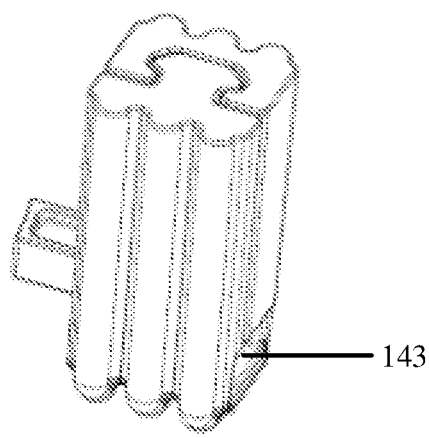
FIG. 4C is a stereogram of the potting spacer shown in FIG. 4A, wherein the first portion and the second portion of the potting spacer are in a closed status, according to an embodiment of the present disclosure.

Referring to FIGS. 4A to 4C, in certain embodiments, the potting spacer 140 is provided with a through hole 143 through which an electrical conductor may pass though.

The electrical conductor is a conductor component intended to establish an electrical connection between electrical elements. It, for example, may be an industrial bus, for example, a Control Area Network (CAN) bus, or may be a conducting wire. The embodiments of the present disclosure are not limited to a specific composition or type of the electrical conductor.

The electrical conductor, for example, may be in a fixed position in the electrical apparatus; for example, one of its ends may be connected to the first electrical element, and the other end is connected to the second electrical element. Alternatively, only one of its ends may be fixed to a first electrical element, and the other end may comprise a plurality of connecting terminals, and the electrical conductor may optionally be connected to a second electrical element and a third electrical element which is in a different position relative to the second electrical element. An embodiment of the present disclosure is not limited to a specific electrical element to which the electrical conductor is connected.

The electrical conductor, for example, may extend in a direction parallel to an axial centre line Ox of an electrical conductor of the electrical apparatus, or may also extend forming an angle relative to the axial centre line.

The potting spacer 140 comprises a first portion 141 and a second portion 142 hinged together. When the first portion 141 and the second portion 142 are in an open status, the through hole opens in the components of the first portion 141 and the second portion 142, and the electrical conductor is able to enter the through hole 143 through the open portion of the through hole. When the first portion 141 and the second portion 142 which are hinged together are assembled together, the electrical conductor is mounted in the through hole 143.

The first portion 141 and the second portion 142, for example, may, as shown in FIG. 4A, be hinged together at their bottom ends, alternatively, based on actual needs, the first portion 141 and the second portion 142 may also be hinged together at their top ends.

The open status is intended to characterize a status in which the first portion and second portion of the potting spacer have not been assembled. The closed status is intended to characterize a status in which the first portion and second portion of the potting spacer have been assembled together.

The first portion and the second portion, for example, may be assembled by concave-convex fit, or may be assembled in another manner.

Figure 5A:
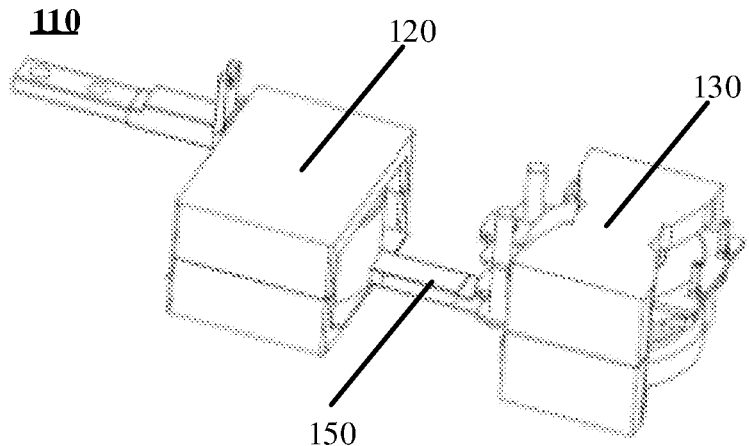
FIG. 5A is a stereogram of the chamber 110 in which a bus 150 is disposed according to an embodiment of the present disclosure.
Figure 5B:
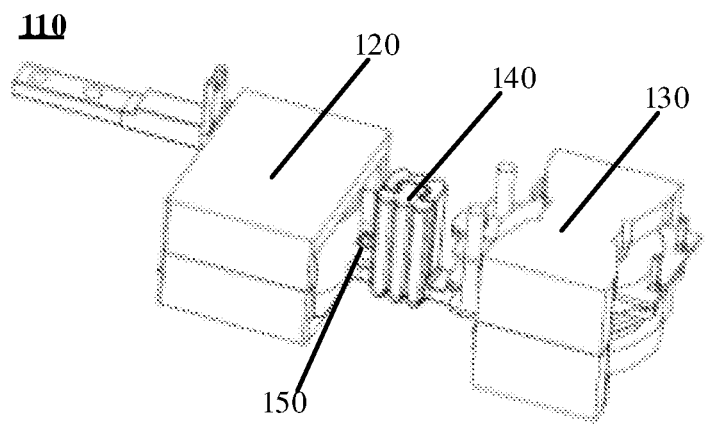
FIG. 5B is a stereogram of the chamber 110 shown in FIG. 5A in which a potting spacer is mounted, according to an embodiment of the present disclosure.

FIGS. 5A to 5B show an embodiment of the above-described potting spacer which is provided with a first portion and second portion. FIG. 5A is a stereogram of the chamber 110 in which a bus 150 is disposed according to an embodiment of the present disclosure, and FIG. 5B is a stereogram of the chamber 110 shown in FIG. 5A in which a potting spacer is mounted.

For example, referring to FIG. 5A, when the electrical conductor is a bus 150 which is arranged on the axial centre line of the chamber of the electrical apparatus and extends along the axial centre line Ox through the first sub-chamber and the second sub-chamber, in this case, when the potting spacer 140 is mounted, for example, first, the first portion 141 and the second portion 142 of the potting spacer 140 are configured to enter an open status, the potting spacer 140 is configured to pass through the bus 150 from the bottom of the bus 150, and the bus 150 is configured to enter a through hole on the potting spacer. Then, the first portion 141 and the second portion 142 which are hinged together are assembled so that the bus 150 is mounted in the through hole 143. FIG.

5B is a view in which the potting spacer is mounted in position in the above-described manner.

Based on the preceding description, by providing that the potting spacer includes a first portion and a second portion which are hinged together and a through-hole disposed thereon through which an electrical conductor may pass, when an electrical conductor is provided in a chamber of the electrical apparatus, the potting spacer may be located in the chamber while the electrical conductor is hold in position in the potting spacer. Thus, electrical connections in an electrical apparatus are not broken due to separation of the chamber, so that the electrical apparatus fulfils its functions properly.

In certain embodiments, the electrical conductor connects the first electrical element 120 to the second electrical element 130.

Based on the above, by providing an electrical conductor for connecting the first electrical element to the second electrical element, after a chamber is separated into a first sub-chamber and a second sub-chamber, a good electrical connection status is still maintained between electrical elements located in different sub-chambers to transfer relevant signals, thereby ensuring that the electrical apparatus fulfils its functions properly.

In certain embodiments, the first portion 141 and the second portion 142 are assembled by the fit of a groove and a projection.

For example, referring to FIG. 4A, a groove is disposed on the first portion 141 of the potting spacer, and a protrusion which fits the groove is disposed on the second portion 142 of the potting spacer.

However, it should be understood that an embodiment of the present disclosure is not limited thereto. the groove and protrusion, for example, may be disposed on the entire joint surface of the first portion and the second portion, or may also be disposed only in a region of the joint surface of the first portion and the second portion, for example, being disposed in a central region of the joint surface of the first portion and the second portion, or being disposed in the bottom portion of the joint surface.

In certain embodiments, at least one rib is further disposed on the protrusion, and a recess fitting the at least one rib is disposed on the groove; by a fit between a rib on the protrusion and the recess on the groove, the protrusion and the groove fit each other closely, enhancing the air-tightness of the joint portion.

However, it should be understood that disposition of a rib is not limited to the above-described embodiment; for example, at least one rib may also be disposed on the groove, and a recess fitting the rib may be disposed on the protrusion.

Based on the above, the first portion and the second portion are assembled by a fit between a groove and a protrusion, so that the first portion and second portion of the potting spacer may be assembled properly, thereby making it convenient to mount the potting spacer in a chamber of the electrical apparatus. In addition, when an electrical conductor is provided, this helps keep the electrical conductor in position, in a closed status in which the first portion and the second portion are assembled.

In certain embodiments, the through hole is provided with at least one contact rib on a surface in contact with the electrical conductor.

Referring to FIG. 4A, an extension direction of the at least one contact rib, for example, may be perpendicular to an extension direction of the electrical conductor, or an extension direction of the at least one contact rib may also be parallel to an extension direction of the electrical conductor.

The contact rib, for example, may be disposed only on one of the surfaces which come into contact with the electrical conductor, for example, being disposed only on an upper joint surface which comes into contact with the electrical conductor and is located above the electrical conductor, or may also be disposed on a plurality of surfaces which come into contact with the electrical conductor, for example, being disposed on an upper joint surface which comes into contact with the electrical conductor and is located above the electrical conductor and on a lower joint surface which comes into contact with the electrical conductor and is located below the electrical conductor.

Based on the above, by the disposition of at least one contact rib on a surface on which a through hole of a potting spacer comes into contact with the electrical conductor, the through hole of the potting spacer may come into close contact with the electrical conductor to enhance the sealing of the region of joint between the through hole and the electrical conductor, thereby keeping the electrical conductor buckled in position in the through hole and preventing potting materials in the first sub-chamber and second sub-chamber from flowing into the through hole.

In certain embodiments, the potting spacer 140 is formed into a single piece. By the formation of the potting spacer into a single piece, the manufacture process is simplified and the manufacture cost can be reduced. In addition, compared with a situation where a potting spacer is formed by joining a plurality of portions, such formation enhances the sealing of the potting spacer itself, which helps prevent a potting material in the first sub-chamber from flowing into the second sub-chamber and prevent a potting material in the second sub-chamber from flowing into the first sub-chamber, thereby improving the sealing of each sub-chamber in the potting process.

Figure 6A:
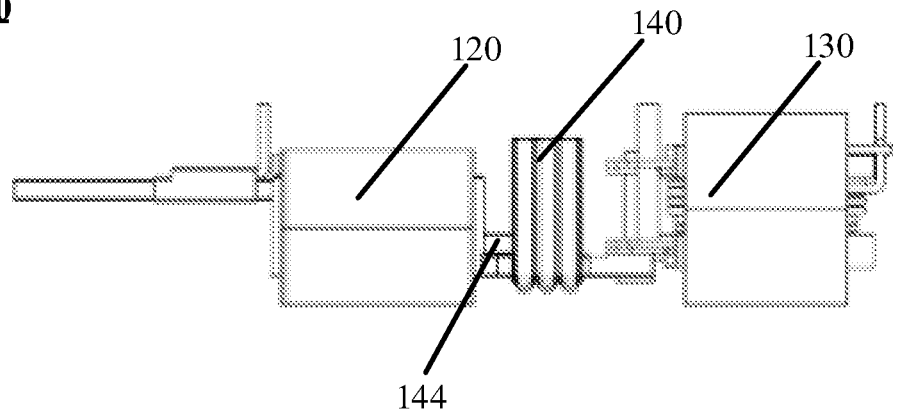
FIG. 6A is a front view of the chamber 110 of an electrical apparatus according to an embodiment of the present disclosure, wherein a positioning portion is disposed in the potting spacer of the chamber 110.
Figure 6B:
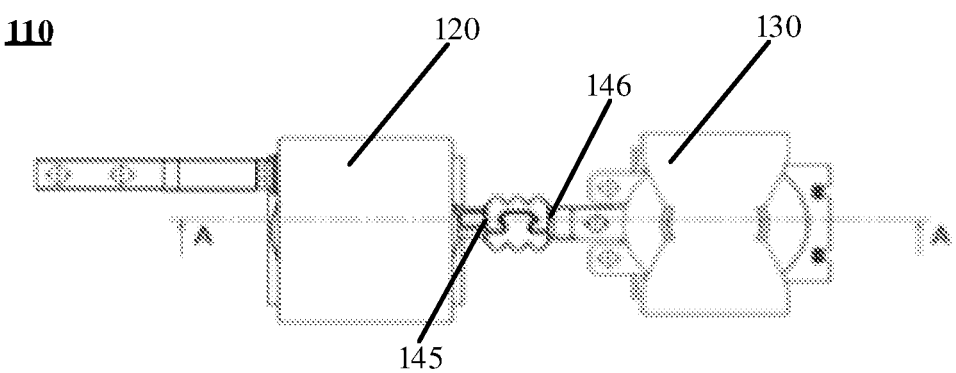
FIG. 6B is a top view of the chamber 110 of the electrical apparatus shown in FIG. 6A, according to an embodiment of the present disclosure.
Figure 6C:
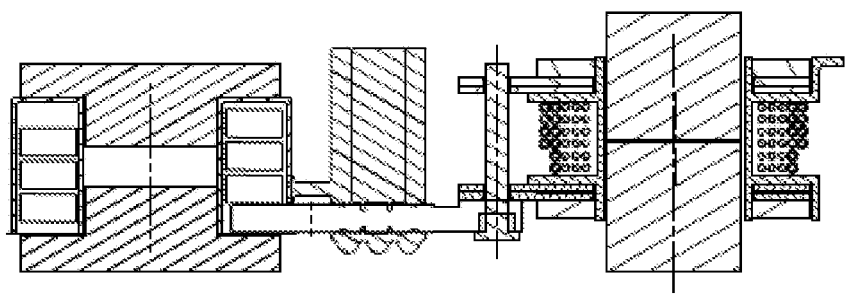
FIG. 6C is a sectional view taken along line A-A in FIG. 6B, according to an embodiment of the present disclosure.

FIGS. 6A to 6C are views of a potting spacer in which a positioning portion is disposed according to an embodiment of the present disclosure. Among them, FIG. 6A is a front view of the chamber 110 of an electrical apparatus according to an embodiment of the present disclosure, wherein a positioning portion is disposed in the potting spacer of the chamber 110; FIG. 6B is a top view of the chamber 110 of the electrical apparatus shown in FIG. 6A; and FIG. 6C is a sectional view taken along line A-A in FIG. 6B.

Referring to FIGS. 6A to 6C, in certain embodiments, the potting spacer 140 includes a first dividing sidewall 145 which faces the first sub-chamber 111 and a second dividing sidewall 146 which faces the second sub-chamber 112, and a positioning portion 144 is disposed on at least one of the first dividing sidewall 145 and the second dividing sidewall 146, the positioning portion 144 makes the potting spacer 140 to be kept in position in the chamber 110.

The positioning portion is intended to position the potting spacer in the chamber. The positioning portion, for example, may be disposed on the first dividing sidewall only, or may also be disposed on both of the first dividing sidewall and the second dividing sidewall. It, for example, may be disposed on a central region of the first dividing sidewall, or may also be disposed at the bottom end of the first dividing sidewall.

As shown in FIG. 6A, the positioning portion, for example, may be a protruding portion which extends along an axial centre line of the chamber, or may also be a grooved portion or be in another shape for positioning relative to the chamber.

As shown in FIG. 6A, the positioning portion, for example, may be pressed against the first electrical element so that the potting spacer is positioned in an axial direction relative to a chamber of the electrical apparatus, or the positioning portion may also be pressed against the second electrical element, or pressed against a sidewall of a chamber, or be positioned in an axial direction relative to the chamber.

Based on the preceding description, by the disposition of a positioning portion on at least one of the first dividing sidewall and second dividing sidewall of a potting spacer, the potting spacer may be properly positioned in an axial direction relative to the chamber, thus preventing shifting of the potting spacer in an axial direction, which may affect the sealing of the first sub-chamber and second sub-chamber.

In certain embodiments, the potting spacer is made of rubber. By the manufacture of a potting spacer with rubber, the potting spacer, while having high elasticity, offers high resistance to elevated temperatures. Thus, when the first potting material of the first sub-chamber and the second potting material of the second sub-chamber are cured at a high temperature, for example, when the first potting material and the second potting material are cured at 100° C., the potting spacer may still deliver good process performance and separate a chamber properly.

In certain embodiments, the electrical apparatus is formed into a charging apparatus for a vehicle, or an inverter, or a direct current-direct current (DC-DC) converter.

The charging apparatus is a device for charging a battery for a motor vehicle. It, for example, may be disposed independently of a vehicle and, when in use, is connected, by a power line, to a battery of the vehicle which is to be charged. Alternatively, it may be configured in a vehicle. An embodiment of the present disclosure is not limited to a specific manner of configuring the charging apparatus relative to the motor vehicle.

The charging apparatus, for example, may be a large or medium-sized roadside charging pile, or may also be a low-power charger; for example, it may be a low-power charger which supplies 3.5 kW power, or may also be a low-power charger which supplies 7 kW power. An embodiment of the present disclosure is not limited to a specific structure, size, or power of the charging apparatus.

The inverter is intended to characterize a device for converting a direct current (DC) into an alternating current (AC); it, for example, may be composed of an inverter bridge, a control logic, and a filter circuit, or may also be composed of another component. An embodiment of the present disclosure is not limited to a specific composition of the inverter or a manner of configuring it in a motor vehicle.

The DC-DC converter is intended to characterize a device for converting the DC power source into a DC or approximately DC power source which outputs a different voltage. Based on an actual need, it, for example, may output a 14 V DC voltage. An embodiment of the present disclosure is not limited to a specific composition of the DC-DC converter or its output voltage.

Based on the preceding description, by the formation of the electrical apparatus into an apparatus capable of fulfilling different functions for a motor vehicle according to actual needs, different user needs may be met and corresponding functions may be implemented properly. In addition, separating a chamber of the electrical apparatus into a first sub-chamber and a second sub-chamber allows effective potting of the first sub-chamber and the second sub-chamber and a reduction in manufacture costs.

Figure 7:
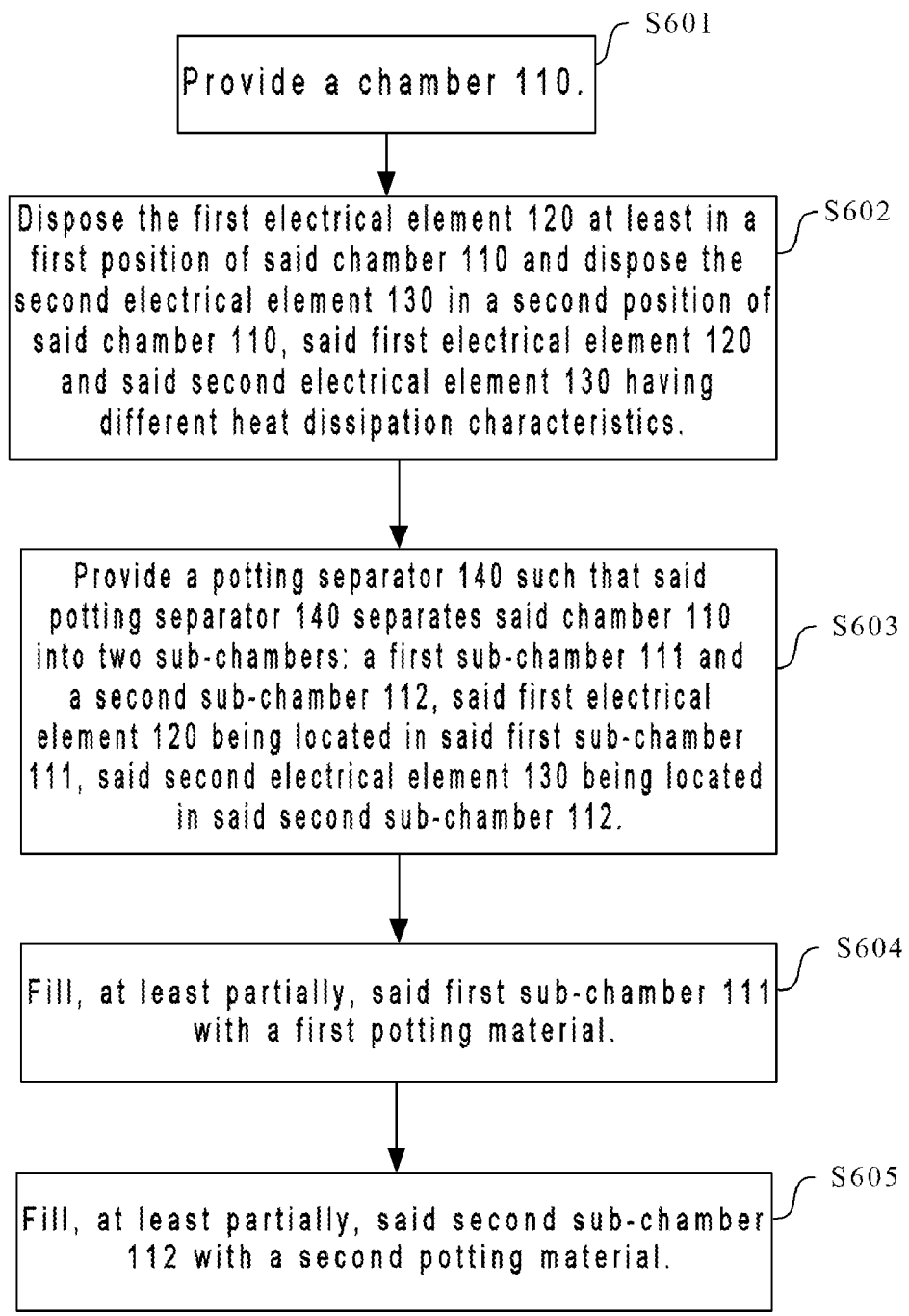
FIG. 7 is an illustrative flowchart for a method 600 for manufacturing an electrical apparatus according to an embodiment of the present disclosure.

According to another aspect of the present disclosure, a method for manufacturing an electrical apparatus is proposed. FIG. 7 is an illustrative flowchart for a method 600 for manufacturing an electrical apparatus according to an embodiment of the present disclosure.

Referring to FIG. 7, the method comprises: first, in step S601, a chamber 110 is provided, and then, in step S602, a first electrical element 120 is disposed at least at a first position of the chamber 110 and a second electrical element 130 is disposed at a second position of the chamber 110, the first electrical element 120 and the second electrical element 130 having different heat dissipation characteristics.

After the first electrical element and the second electrical element are disposed, in step S603, a potting spacer 140 is provided, and the potting spacer 140 is configured to separate the chamber 110 into two sub-chambers: a first sub-chamber 111 and a second sub-chamber 112, the first electrical element 120 is located in the first sub-chamber 111, the second electrical element 130 is located in the second sub-chamber 112.

Based on the preceding description, a potting spacer is used to separate a chamber in an electrical apparatus into a first sub-chamber and a second sub-chamber, and a first electrical element and a second electrical element in the chamber which have different heat dissipation characteristics are located, respectively, in the first sub-chamber and the second sub-chamber obtained after the separation. Thus, when the electrical apparatus is potted, based on respective heat dissipation characteristics possessed by the first electrical element and the second electrical element, different potting materials may be selected for the first sub-chamber and the second sub-chamber, and the first sub-chamber and the second sub-chamber may be potted, respectively, to reach different potting heights. Compared with a situation in which the same chamber is potted, an electrical apparatus of the present application allows selection of potting materials based on heat dissipation characteristics of different electrical elements, effectively meeting heat dissipation needs of different electrical elements. In addition, when a plurality of electrical elements in the same chamber are potted, it prevents the problem of a waste of potting materials which occurs because the potting height is larger than heights actually needed by certain electrical elements, and further allowing the electrical apparatus to have a relatively small total weight.

In certain embodiments, heat dissipation characteristics of the first electrical element 120 and the second electrical element 130 include a heat dissipation height of the first electrical element 120 and of the second electrical element 130 and/or a heat dissipation parameter of the first electrical element 120 and of the second electrical element 130.

The heat dissipation height is intended to characterize a height of heat dissipated by the electrical element. It, for example, may be the height of a heat dissipatior carried by the electrical element, or may also be the height of a hole-like heat-dissipating region provided on sidewalls of the electrical element.

The heat dissipation parameter is a parameter which characterizes the ability of the electrical element to dissipate heat to the outside environment. It, for example, may be heat dissipation rate, that is, the amount of heat dissipated by the electrical element to the outside environment in unit time. It, for example, may be characterized by watts per second (watt/s). Alternatively, the heat dissipation rate may also be another parameter, for example, detecting the amount of heat dissipated by the electrical element in unit time in an ultimate status and using it as the heat dissipation parameter.

Based on the preceding description, in the present application, heat dissipation characteristics include the heat dissipation height of an electrical element and the heat dissipation parameter of the electrical element. Thus, based on the heat dissipation height and heat dissipation parameter of the electrical element, a potting material and its potting height may be selected rationally, so that, in the process of potting, the heat dissipation needs of different electrical elements are better met, and the working efficiencies and service life of the electrical elements in the electrical apparatus are increased.

Further, referring to FIG. 7, in certain embodiments, the method further comprises: in step S604, filling, at least partly, the first sub-chamber 111 with a first potting material, and in step S605, filling, at least partly, the second sub-chamber 112 with a second potting material, wherein the first potting material and the second potting material are different in at least one of materials, potting heights, and heat conductivities.

The potting material characterizes a material for potting an inner chamber of an electrical apparatus. The potting process characterizes an industrial process in which a liquid compound is mechanically or manually poured into a device loaded with electrical elements and circuits and, at room temperature or by heating, it is cured into a thermosetting high-molecular insulation material which delivers excellent performance. In addition, the potting material, for example, may be potting glue, or may be a resin, or may be another material which can fill, at least partly, a chamber and then can be cured at room temperature or by heating.

The potting height of the potting material is intended to characterize the height by which the potting material fills a chamber of the electrical apparatus, and, for example, may be set on the basis of actual needs; for example, the potting height of the potting material may be set to the maximum heat dissipation height of the electrical elements in the chamber, or the potting height of the potting material may also be set to 1.2 times the maximum heat dissipation height of the electrical elements.

Heat conductivity of the potting material is a parameter which characterizes the heat conducting ability of the potting material. Higher heat conductivity characterizes a greater heat conducting ability of the potting material, that is, conducting more heat in unit time and producing a better heat dissipation effect.

The first potting material and the second potting material, for example, may both be a single potting material, or may also each be a compound potting material compounded of a plurality of potting materials.

It should be understood that steps S604 and S605 may be performed concurrently or in sequence, and that no limitations are imposed thereon.

According to another aspect of the present disclosure, a motor vehicle is provided, comprising the above-described electrical apparatus.

The motor vehicle may be a plug-in hybrid electric vehicle, a battery electric vehicle, or another type of motor vehicle. An embodiment of the present disclosure is not limited to a specific type of the motor vehicle.

Based on the preceding description, the motor vehicle may fulfil the functions of the above-described apparatus and have the above-described advantages.

In the present application, specific terms are used to describe embodiments of the present application. For example, "first/second embodiment", "an embodiment", and/or "certain embodiments" refer to a feature, structure, or characteristic related to at least one embodiment of the present application. Therefore, it should be stressed and noted that "an embodiment", "one embodiment", or "a substitute embodiment" mentioned for two or more times in different parts of the description does not necessarily refer to the same embodiment. In addition, certain features, structures, or characteristics in one or more embodiments of the present application may be combined appropriately.

Further, those of ordinary skill in the art may understand that various aspects of the present application may be explained and described by certain patentable types or situations, including a combination of any novel and useful procedures, machines, products, or substances, or any novel and useful improvements thereon.

Unless otherwise defined, all the terms (including technical and scientific terms) used herein have the same meanings as the terms as commonly understood by those of ordinary skill in the art. It should also be understood that terms, for example, those as generally defined in a dictionary, should be interpreted as having meanings the same as their meanings in the context of related technology, instead of being interpreted in an idealized or extremely formalized sense, unless expressly so defined herein.

The description provided above is illustrative of the present invention, and should not be construed as a limitation thereon. While certain demonstrative embodiments of the present invention have been described above, those of ordinary skill in the art will easily understand that many modifications may be made to a demonstrative embodiment without departing from the novel teaching or an advantage of the present invention. Therefore, all such modifications are intended to fall within the scope of the present invention as defined by the claims. It should be understood that the description given above is illustrative of the present invention, and the present invention should not be deemed to be limited by specific disclosed embodiments; in addition, modifications made to the disclosed embodiments and other embodiments are intended to fall within the scope defined by the attached claims. The present invention is defined by the claims and equivalents thereof.

What is claimed is:

1. An electrical apparatus, comprising:
   a chamber comprising a first electrical element located at a first position and a second electrical element located at a second position,
   the first electrical element and the second electrical element having different heat dissipation characteristics; and
   a potting spacer, mounted between two opposing inner chamber sidewalls in the chamber, separating the chamber into two sub-chambers comprising a first sub-chamber and a second sub-chamber, respectively,
   wherein the first electrical element is located in the first sub-chamber and the second electrical element is located in the second sub-chamber, and
   wherein the potting spacer has engagement sidewalls which come into contact with the inner chamber sidewalls, the engagement sidewalls comprising at least one rib disposed on the engagement sidewalls.

2. The electrical apparatus according to claim 1, wherein the heat dissipation characteristics of the first electrical element and the second electrical element comprise a heat dissipation height of the first electrical element and the second electrical element, and a heat dissipation parameter of the first electrical element and of the second electrical element.

3. The electrical apparatus according to claim 1, wherein a first potting material at least partly filling the first sub-chamber and a second potting material at least partly filling the second sub-chamber are different in at least one of: materials, potting heights, and heat conductivities.

4. The electrical apparatus according to claim 1, wherein the potting spacer is made of a compressible material.

5. The electrical apparatus according to claim 4, wherein the potting spacer is mounted by press-fit between two opposite inner chamber sidewalls in the chamber.

6. The electrical apparatus according to claim 1, wherein the potting spacer is formed into a single piece.

7. The electrical apparatus according to claim 1, wherein the potting spacer comprises a first dividing sidewall which faces the first sub-chamber and a second dividing sidewall which faces the second sub-chamber, and a positioning portion is disposed on at least one of the first dividing sidewall and the second dividing sidewall, the positioning portion locating the potting spacer in position in the chamber.

8. The electrical apparatus according to claim 1, wherein the potting spacer is made of rubber.

9. The electrical apparatus according to claim 1, the electrical apparatus forming a charging apparatus for a vehicle, or an inverter, or a direct current-direct current converter.

10. A motor vehicle comprising: the electrical apparatus according to claim 1.

11. An electrical apparatus, comprising:
a chamber comprising a first electrical element located at a first position and a second electrical element located at a second position,
the first electrical element and the second electrical element having different heat dissipation characteristics; and
a potting spacer separating the chamber into two sub-chambers comprising a first sub-chamber and a second sub-chamber, respectively,
wherein the first electrical element is located in the first sub-chamber and the second electrical element is located in the second sub-chamber,
wherein the potting spacer is provided with a through-hole through which an electrical conductor passes, and wherein the potting spacer comprises a first portion and a second portion hinged together, the electrical conductor configured to enter the through-hole when the first portion and the second portion are in an open status, and the electrical conductor is mounted in the through-hole after the first portion and the second portion are assembled together.

12. The electrical apparatus according to claim 11, wherein the electrical conductor connects the first electrical element to the second electrical element.

13. The electrical apparatus according to claim 11, wherein the first portion and the second portion are assembled by a groove and a protrusion which fit each other.

14. The electrical apparatus according to claim 11, wherein the through-hole is provided with at least one contact rib on a surface in contact with the electrical conductor.

15. A method for manufacturing an electrical apparatus, the method comprising:
providing a chamber;
disposing a first electrical element at least at a first position of the chamber;
disposing a second electrical element at a second position of the chamber,
the first electrical element and the second electrical element having different heat dissipation characteristics; and
providing a potting spacer mounted between two opposing inner chamber sidewalls in the chamber, separating the chamber into two sub-chambers comprising a first sub-chamber and a second sub-chamber, respectively, and the first electrical element is located in the first sub-chamber and the second electrical element is located in the second sub-chamber,
wherein the potting spacer has engagement sidewalls which come into contact with the inner chamber sidewalls, the engagement sidewalls comprising at least one rib disposed on the engagement sidewalls.

16. The method according to claim 15, wherein the heat dissipation characteristics of the first electrical element and the second electrical element comprise a heat dissipation height of the first electrical element and of the second electrical element and/or a heat dissipation parameter of the first electrical element and of the second electrical element.

17. The method according to claim 15, further comprising:
filling, at least partly, the first sub-chamber with a first potting material; and
filling, at least partly, the second sub-chamber with a second potting material,
the first potting material and the second potting material are different in at least one of: materials, potting heights, and heat conductivities.

* * * * *